US006974346B2

(12) United States Patent  (10) Patent No.: US 6,974,346 B2
Liao  (45) Date of Patent: Dec. 13, 2005

(54) LAND GRID ARRAY CONNECTOR ASSEMBLY WITH PICK UP CAP

(75) Inventor: Fang-Jwu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/877,875

(22) Filed: Jun. 25, 2004

(65) Prior Publication Data

US 2004/0266247 A1  Dec. 30, 2004

(30) Foreign Application Priority Data

Jun. 25, 2003  (TW) .............................. 92211553 U

(51) Int. Cl.7 ........................ H01R 4/50; H01R 13/625
(52) U.S. Cl. ........................ 439/342; 439/41; 439/901
(58) Field of Search ........................... 439/342, 41, 42, 439/135, 892, 901

(56) References Cited

U.S. PATENT DOCUMENTS

| | | | |
|---|---|---|---|
| 6,413,111 B1 | 7/2002 | Pickles et al. | |
| 6,478,588 B1 | 11/2002 | Howell et al. | |
| 6,533,592 B1 | 3/2003 | Chen et al. | |
| 6,547,609 B2 | 4/2003 | Howell et al. | |
| 6,561,825 B1 | 5/2003 | McHugh et al. | |
| 6,572,383 B1 | 6/2003 | Yu | |
| 6,877,990 B2 * | 4/2005 | Liao et al. | ............... 439/41 |
| 2003/0176096 A1 * | 9/2003 | Tsai | ............... 439/342 |

* cited by examiner

Primary Examiner—Hae Moon Hyeon
(74) Attorney, Agent, or Firm—Wei Te Chung

(57) ABSTRACT

An LGA connector assembly (1) includes an LGA connector (2) and a generally rectangular pick up cap (3). The connector has a metal clip (25, 25') having a pair of arcuate lateral sides (256). The pick up cap has a plane top surface (300) and a bottom surface (301). A pair of supporting members (309, 300') is formed at opposite lateral sides of the pick up cap respectively, each supporting member depending from the bottom surface. When the pick up cap is engagingly mounted on a top portion of the connector, the supporting members are tightly attached on the lateral sides of the clip to support the pick up cap. A vacuum suction device can reliably engage the top surface of the pick up cap without causing damage to the pick up cap. The LGA connector assembly can thus be safely moved to a desired location on a PCB.

16 Claims, 5 Drawing Sheets

LAND GRID ARRAY CONNECTOR ASSEMBLY WITH PICK UP CAP

CROSS-REFERENCE TO RELATED APPLICATION

The present invention is related to a co-pending U.S. patent application Ser. No. 10/613,468 filed on Jul. 3, 2003, entitled "LAND GRID ARRAY CONNECTOR ASSEMBLY WITH PICK UP CAP," invented by Fang-Jwu Liao, and assigned to the same assignee as the present invention.

BACKGROUD OF THE INVENTION

1. Field of the Invention

The present invention relates to a land grid array (LGA) connector assembly which comprises an LGA connector and a pick up cap, the pick up cap being mounted to the connector for providing a plane top surface to be engaged by a vacuum suction device, whereby the LGA connector assembly can be moved onto a circuit substrate such as a printed circuit board (PCB) on which the connector is to be mounted.

2. Description of the Prior Art

On many production lines, electronic components such as electrical connectors are accurately positioned on circuit substrates such as printed circuit boards (PCBs) by means of vacuum suction devices. Generally, a typical connector has a multiplicity of holes in a flat top portion thereof. Thus the connector does not have a suitably smooth, integral top surface for engagement by a vacuum suction device. Typically, a pick up cap is attached on the top portion of the connector to provide the required plane top surface. Such pick up caps are disclosed in U.S. Pat. Nos. 6,413,111, 6,478,588, 6,533,592, 6,547,609, 6,561,825 and 6,572,383.

FIG. 6 is an isometric view of a conventional pick up cap 9 used in an electrical connector (not shown). The pick up cap 9 has a substantially rectangular body portion 91. The body portion 91 has a plane top surface 910, and a bottom surface 911 opposite to the top surface 910. A pair of first clasp 92 is formed at opposite sides of a front end of the body portion 91 respectively, and a pair of spaced second clasp 93 is formed at a middle portion of a rear end of the body portion 91. The first clasps 92 and the second clasps 93 snappingly clasp corresponding edges of a top portion of the connector, with the bottom surface 911 of the pick up cap 9 tightly engaging on the top portion of the connector. The pick up cap 9 is thereby securely mounted onto the connector, and the top portion of the connector supports the pick up cap 9. In this position, a vacuum suction device (not shown) can engage the top surface 910 of the pick up cap 9 in order to move the connector to a desired location on a PCB (not shown).

However, some electrical connectors have arcuate top portions, such that gaps exist between the bottom surfaces 911 of the pick up caps 9 and top portions of the connectors. FIG. 7 is an exploded, isometric view of a typical land grid array (LGA) connector 8. The LGA connector 8 comprises a generally rectangular insulative housing 81, a plurality of electrical contacts 82 received in the housing 81, a metal stiffener 83 partly covering and reinforcing the housing 81, a lever 84 pivotably received in an end of the stiffener 83, and a metal clip 85 pivotably mounted to an opposite end of the stiffener 83 for engaging with the lever 84. The clip 85 has a pair of parallel arcuate sides 850. The housing 81 defines a generally rectangular cavity 810 in a middle thereof, for receiving an electronic package such as a central processing unit (CPU) (not shown) therein. When oriented at a horizontal position parallel to a top portion of the housing 81 and securely engaged by the lever 84, the clip 85 presses the CPU down to electrically contact the contacts 82 of the connector 8. FIG. 8 is a side elevation view of the pick up cap 9 mounted onto a top portion of the connector 8. The first clasps 92 and the second clasps 93 snappingly clasp corresponding edges of the clip 85. An arcuate gap 7 exists between the bottom surface 911 of the pick up cap 9 and the arcuate sides 850 of the clip 85. The pick up cap 9 spans over the clip 85, with a middle of the pick up cap 9 completely unsupported. When a vacuum suction device (not shown) engages the top surface 910 of the pick up cap 9, the pick up cap 9 is liable to be broken due to compression from the vacuum suction device.

In view of the above, a new pick up cap that overcomes the above-mentioned disadvantages is desired.

SUMMARY OF THE INVENTION

Accordingly, an object of the present invention is to provide a land grid array (LGA) connector assembly which has an LGA connector and a pick up cap mounted on the connector, wherein the pick up cap resists damage by a vacuum suction device engaging a top surface of the pick up cap.

To achieve the above-mentioned object, a land grid array (LGA) connector assembly in accordance with a preferred embodiment comprises an LGA connector and a pick up cap. The connector comprises an insulative housing, a plurality of electrical contacts received in the housing, and a metal clip having a pair of arcuate lateral sides. The housing defines a generally rectangular cavity for receiving an electronic package such as an LGA central processing unit (CPU) therein. A multiplicity of passageways is defined in a portion of the housing under the cavity, the passageways receiving a corresponding number of the contacts therein. The clip is disposed on the housing to press the CPU upon the contacts. The pick up cap has a plane top surface and a bottom surface opposite to the top surface. A pair of parallel elongate arcuate ribs is formed at opposite lateral sides of the pick up cap respectively, each ribs depending from the bottom surface. When the pick up cap engagingly mounted on a top portion of the connector, the ribs are tightly attached on the lateral sides of the clip. The ribs thus effectively act as supporting members to support the pick up cap. A vacuum suction device can reliably engage the top surface of the pick up cap, without causing damage to the pick up cap. The LGA connector assembly can thus be safely moved to a desired location on a circuit substrate, such as a printed circuit board (PCB) (not shown), on which the connector is to be mounted.

Furthermore, an LGA connector assembly in accordance with the alternative embodiment of the present invention comprises an LGA connector and a pick up cap. The connector has the same configuration as that of the connector of the preferred embodiment. The pick up cap has a configuration similar to that of the pick up cap of the preferred embodiment. However, in the alternative embodiment, a pair of cylindrical projecting members is formed at opposite lateral sides of a planar body of the pick up cap. The projecting members are provided as supporting members in place of the ribs of the preferred embodiment. When the pick up cap is mounted onto the clip of the connector, the projecting members abut against arcuate lateral sides of the clip to support the pick up cap. A vacuum suction device can reliably engage the top surface of the pick up cap, without causing damage to the pick up cap. The LGA connector assembly can thus be safely moved to a desired location on a PCB.

Other objects, advantages and novel features of the invention will become more apparent from the following detailed description when taken in conjunction with the accompanying drawings.

DRIEF DESCRIPTION OF THE DRAWINGS

DETAILED DESCRIPTION OF THE PREFERRED EMBODIMENT OF THE INVENTION

Reference will now be made to the drawings to describe the present invention in detail.

Figure 1:
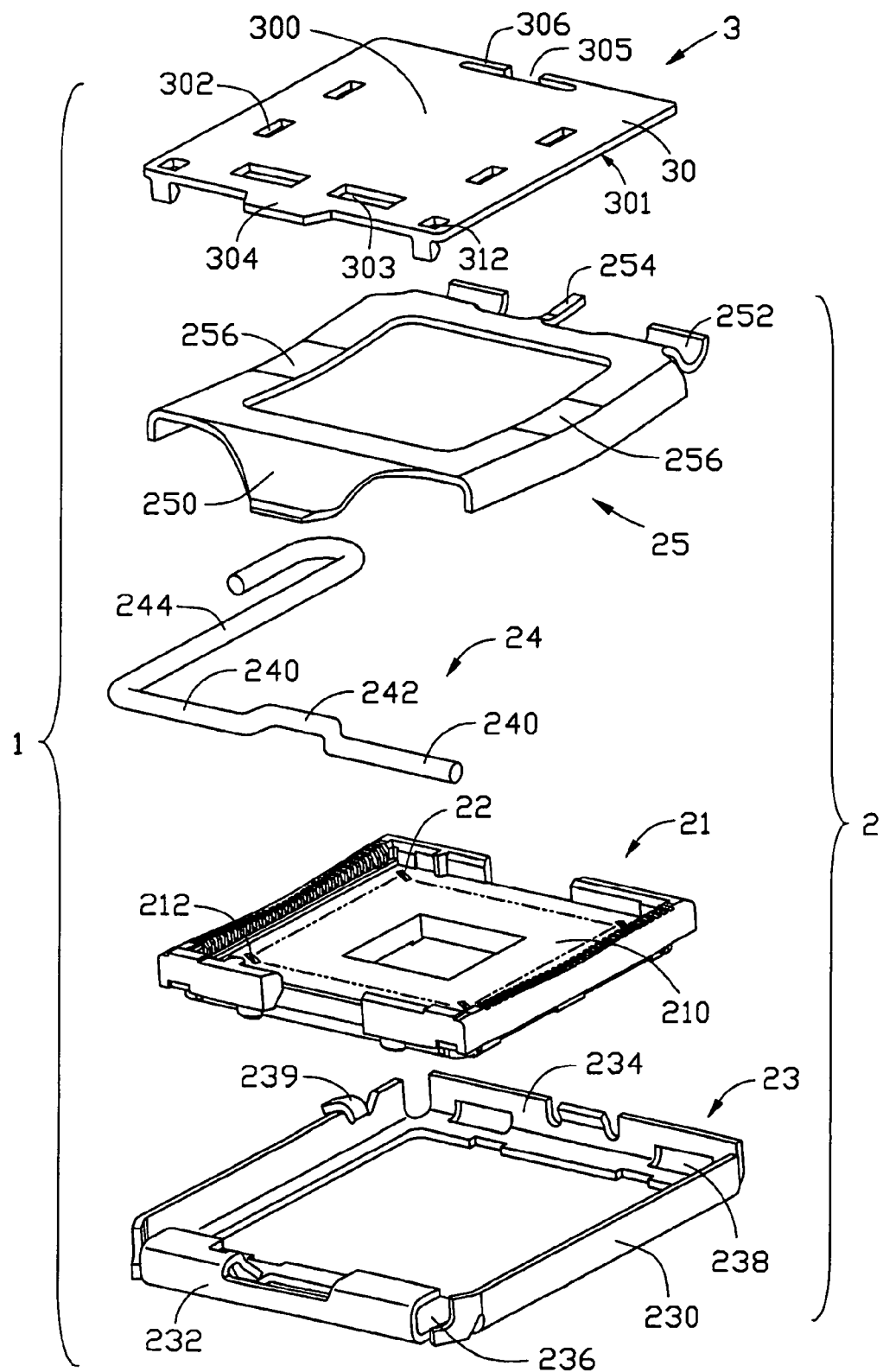
FIG. 1 is an exploded, isometric view of an LGA connector assembly in accordance with the preferred embodiment of the present invention, the LGA connector assembly comprising an LGA connector and a pick up cap mounted onto the connector.

FIG. 1 is an exploded, isometric view of a land grid array (LGA) connector assembly 1 in accordance with the preferred embodiment of the present invention. The LGA connector assembly 1 comprises an LGA connector 2 and a generally rectangular pick up cap 3. The pick up cap 3 is mounted onto the connector 2, for providing a plane top surface to be engaged by a vacuum suction device. The LGA connector assembly 1 can thereby be moved onto a circuit substrate, such as a printed circuit board (PCB) (not shown), on which the connector 2 is to be mounted.

The connector 2 comprises a generally rectangular insulative housing 21, a plurality of electrical contacts 22 received in the housing 21, a metal stiffener 23 partly covering and reinforcing the housing 21, a lever 24 pivotably received in an end of the stiffener 23, and a metal clip 25 pivotably mounted to an opposite end of the stiffener 23 for engaging with the lever 24.

The housing 21 defines a generally rectangular cavity 210 in a middle thereof. The cavity 210 is used for receiving an electronic package such as an LGA central processing unit (CPU) (not shown) therein. A multiplicity of passageways 212 is defined in a portion of the housing 21 under the cavity 210, the passageways 212 receiving a corresponding number of the contacts 22 therein respectively. The stiffener 23 comprises a pair of lateral sides 230 each having an L-shaped cross-section, a front end 232 having a U-shaped cross-section, and a rear end 234 having an L-shaped cross-section. The housing 21 is fittingly received in the stiffener 23. An elongate chamber 236 is defined in the front end 232 of the stiffener 23. A pair of spaced slots 238 is defined in the rear end 234 of the stiffener 23. An ear 239 extends arcuately from an edge of one of the lateral sides 230 of the stiffener 23. The lever 24 comprises a pair of locating portions 240 pivotably received in the chamber 236 of the stiffener 23, an offset actuating portion 242 between the locating portions 240, and an operating portion 244 extending perpendicularly from an end of one of the locating portions 240. The operating portion 244 is disposed outside of the stiffener 23. When oriented at a horizontal position parallel to a top face of the housing 21, the operating portion 244 engages with the ear 239. The clip 25 comprises a pair of parallel arcuate sides 256. An engaging portion 250 extends arcuately from an end of the clip 25. A pair of spaced securing portions 252 extends arcuately from an opposite end of the clip 25, the securing portions 252 being pivotably received in the slots 238 of the stiffener 23. A tail 254 extends from said opposite end of the clip 25, between the securing portions 252. When the clip 25 is oriented at a horizontal position parallel to the top face of the housing 21, the engaging portion 250 of the clip 25 is engaged by the actuating portion 242 of the lever 24, with the clip 25 thereby pressing the CPU on the contacts 22. When the clip 25 is oriented at a position perpendicular to the top face of the housing 21, the tail 254 abuts against the stiffener 23 to prevent the clip 25 from being over-rotated.

The pick up cap 3 has a generally rectangular planar body 30. The planar body 30 comprises a plane top surface 300, and a bottom surface 301 opposite to the top surface 300. Two generally rectangular first holes 302 are defined in each of opposite lateral sides of the planar body 30. Two generally rectangular second holes 303 are defined in a front end of the planar body 30. Each of the second holes 303 is larger than each of the first holes 302. A trapezoidal lip 304 is formed at a middle of the front end of the planar body 30. A generally T-shaped channel 305 is defined in a middle of an opposite rear end of the planar body 30, thereby forming a pair of opposing arms 306.

Figure 2:
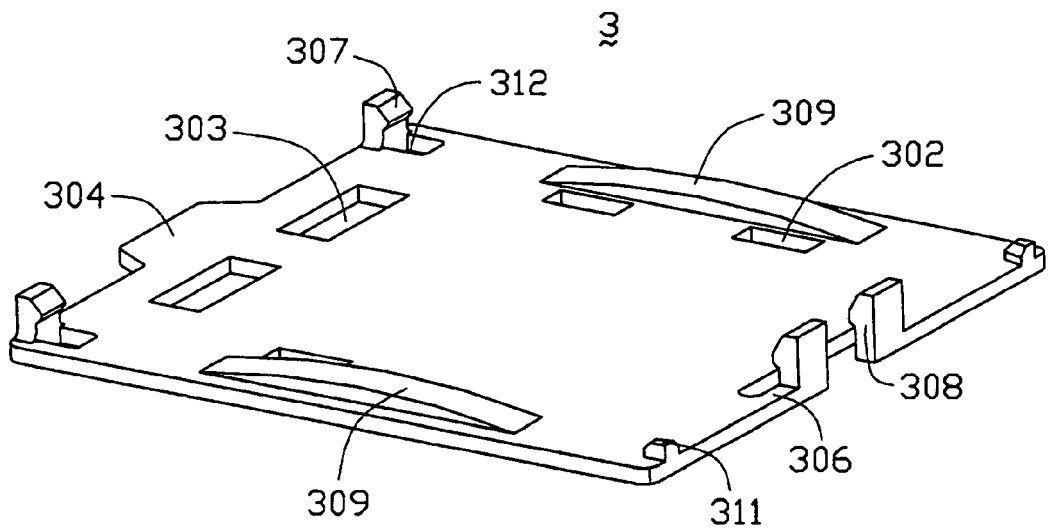
FIG. 2 is an enlarged, isometric view of the pick up cap of FIG. 1, but showing the pick up cap inverted.
Figure 3:
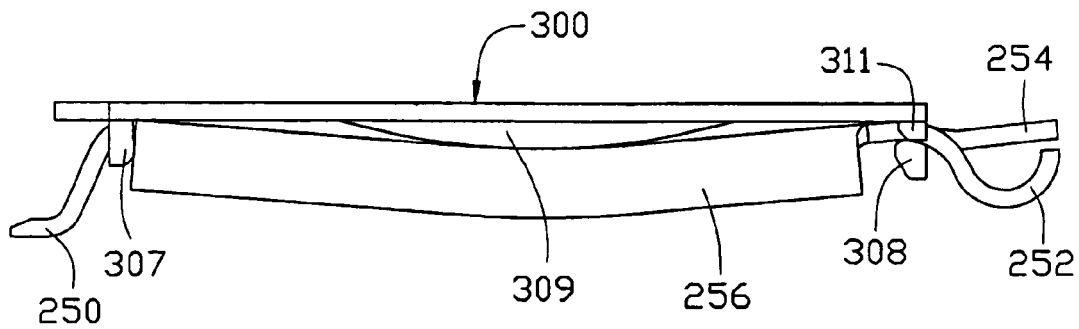
FIG. 3 is an assembled, side elevation view of the pick up cap and a clip of the connector of FIG. 1.

FIG. 2 is an isometric view of the pick up cap 3 inverted. A pair of first clasps 307 is formed at opposite sides of the front end of the planar body 30 respectively. The first clasps 307 depend from the bottom surface 301 of the planar body 30. An opening 312 is defined in a portion of the planar body 30 adjacent a rear of each first clasp 307, thereby increasing a resilience of the first clasp 307. A pair of second clasps 308 is formed at the rear end of the planar body 30. The second clasps 308 depend from free ends of the arms 306 respectively. A pair of protrusions 311 is formed at opposite sides of the rear end of the planar body 30 respectively. The protrusions 311 depend from the bottom surface 301. A pair of parallel elongate arcuate ribs 309 is formed at the opposite lateral sides of the planar body 30 respectively. The ribs 309 depend from the bottom surface 301 and are disposed at outer sides of the corresponding first holes 302.

In attachment of the pick up cap 3 onto the connector 2, the pick up cap 3 is disposed over the connector 2, with the first and second clasps 307, 308 loosely contacting corresponding front and rear edges of the clip 25 respectively. The pick up cap 3 is pressed down. The first clasps 307 and second clasps 308 are elastically deflected outwardly, and snappingly clasp the front and rear edges of the clip 25. Simultaneously, the protrusions 311 abut against the rear edge of the clip 25. The pick up cap 3 is thereby securely mounted onto the connector 2. The channel 305 receives the tail 254 of the clip 25. The ribs 309 of the pick up cap 3 are tightly attached on the lateral sides 256 of the clip 25. The ribs 309 thus effectively act as supporting members to support the pick up cap 3. In this position, a vacuum suction device (not shown) can reliably engage the top surface 300 of the pick up cap 3 without causing damage to the pick up cap 3. The connector assembly 1 can thus be safely moved to a desired location on the PCB.

During welding of the connector assembly 1 on the PCB, the first and second holes 302, 303 facilitate dissipation of generated heat. Once the connector 2 has cooled down, the lip 304 of the pick up cap 3 is pulled upwardly, and the pick up cap 3 is detached from the clip 25 of the connector 2.

Figure 4:
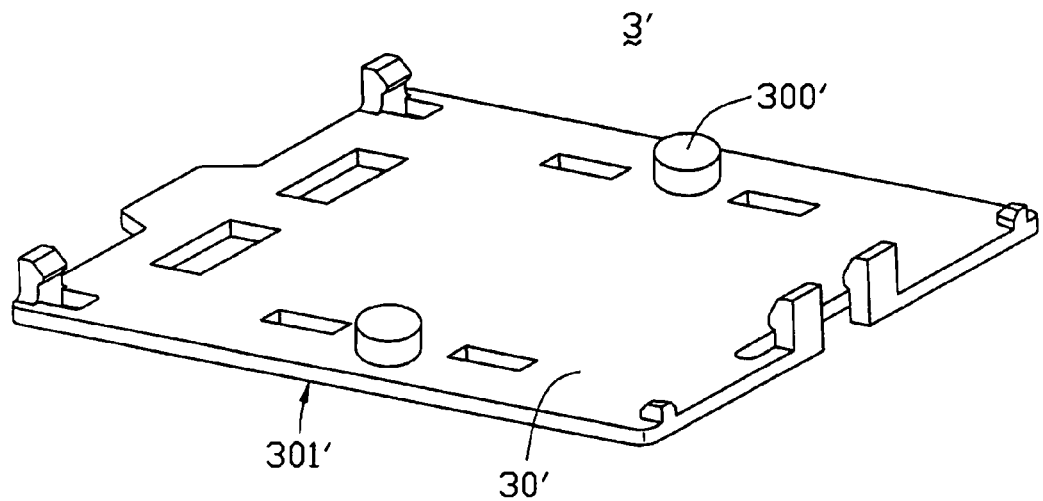
FIG. 4 is an isometric view of a pick up cap of an LGA connector assembly in accordance with the alternative embodiment of the present invention.
Figure 5:
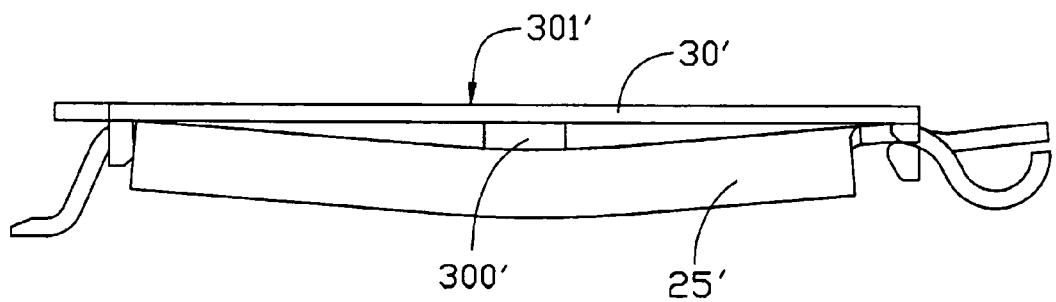
FIG. 5 is an assembled, side elevation view of the pick up cap of FIG. 4 and a clip of an LGA connector of the connector assembly in accordance with the alternative embodiment of the present invention.
Figure 6:
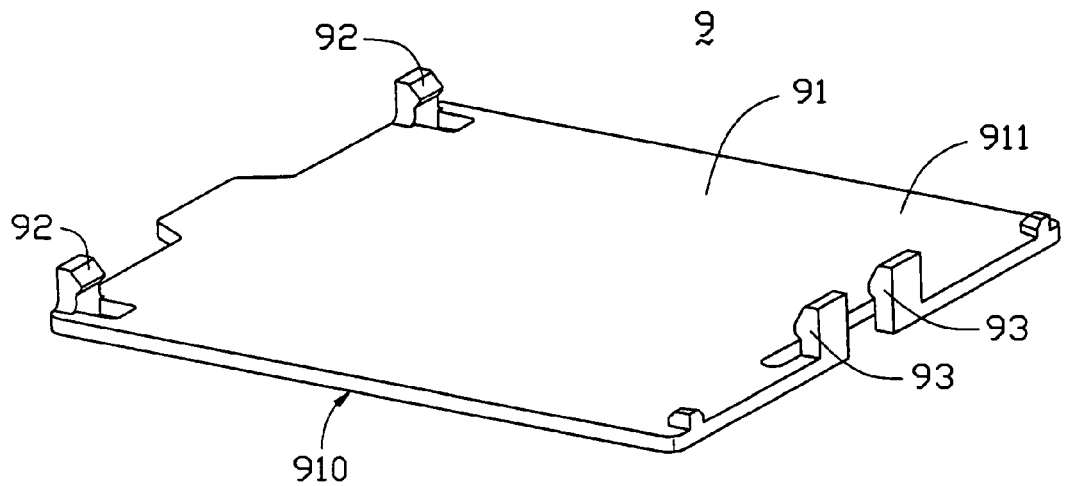
FIG. 6 is an isometric view of a conventional pick up cap.
Figure 8:
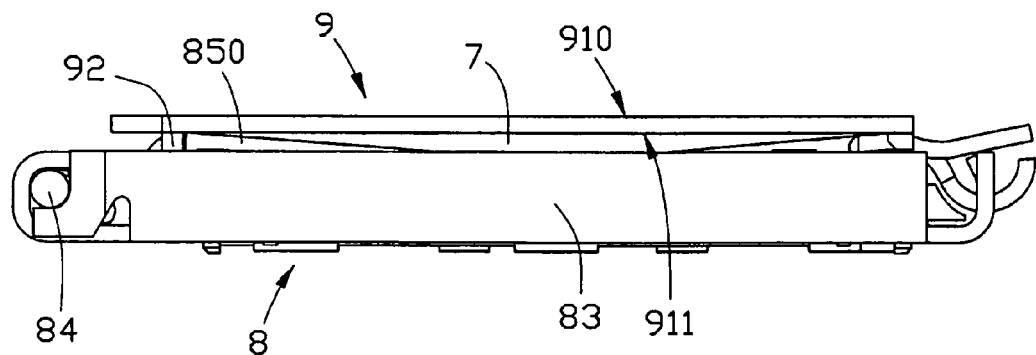
FIG. 8 is an assembled, side elevation view of the pick up cap of FIG. 6 and the connector of FIG. 7.
Figure 7:
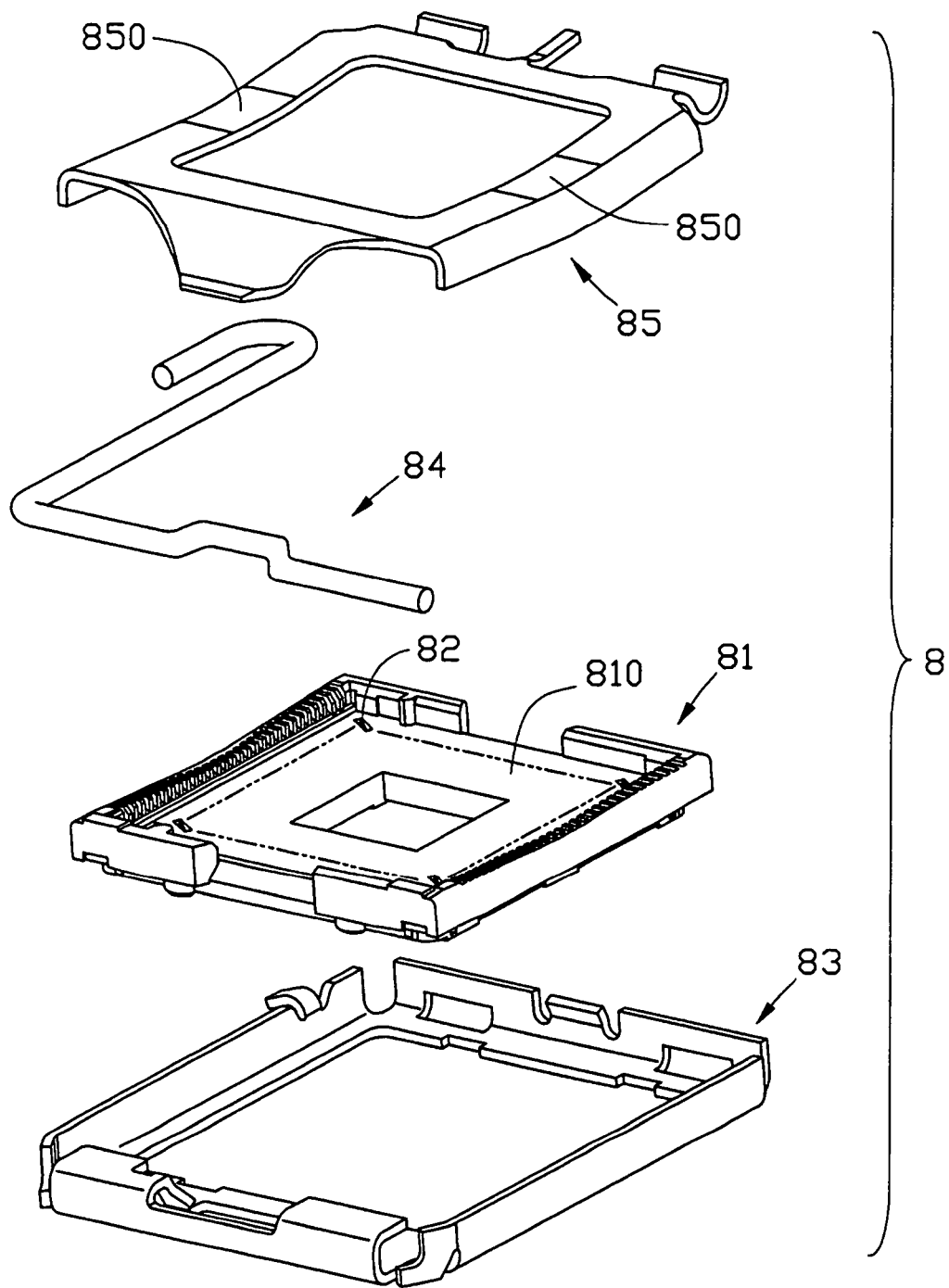
FIG. 7 is an exploded, isometric of a conventional LGA connector.

FIG. 4 is an isometric view of a pick up cap 3' of an LGA connector assembly in accordance with the alternative embodiment of the present invention. The connector assembly comprises an LGA connector and the pick up cap 3'. The connector has the same configuration as that of the connector 2 of the preferred embodiment. The pick up cap 3' has a configuration similar to that of the pick up cap 3 of the preferred embodiment. However, in the alternative embodiment, a pair of projecting members 300' is formed at opposite lateral sides of a planar body 30' of the pick up cap 3' respectively. Each projecting member 300' is cylindrical. The projecting members 300' are provided as supporting members in place of the ribs 309 of the preferred embodiment. FIG. 5 is a side elevation view of the pick up cap 3' connected with a clip 25' of the LGA connector. When the pick up cap 3' is mounted onto the clip 25', the projecting members 300' abut against arcuate lateral sides of the clip 25'. The projecting members 300' thus effectively act as supporting members to support the pick up cap 3'. In this position, a vacuum suction device can reliably engage a plane top surface 301' of the pick up cap 3' without causing damage to the pick up cap 3'. The connector assembly can thus be safely moved to a desired location on a PCB.

In the above-described alternative embodiment, a pair of projecting members 300' is formed at the opposite lateral sides of the planar body 30' of the pick up cap 3', and each projecting member 300' is cylindrical. It should be understood that the shape and number of the projecting members 300' may be varied. For example, each projecting member 300' may be cuboid, frustum-shaped, or hemispherical. Additionally, the projecting members 300' may have different shapes from each other. Furthermore, either or both of the opposite lateral sides of the planar body 30' may have a plurality of projecting members 300'. For example, heights two adjacent projecting members 300' at a same lateral side of the planar body 30' may differ. The shape(s) and number of the projecting members 300' can be configured according to the requirements of a particular application.

From the foregoing it will be recognized that the principles of the invention may be employed in various arrangements to obtain the features, advantages and benefits described above. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed is:

1. A land grid array (LGA) connector assembly, comprising:
    an LGA connector, comprising:
        an insulative housing defining a substantially rectangular cavity in a middle thereof, the cavity being adapted for receiving an electronic package therein;
        a plurality of electrical contacts received in a portion of the housing under the cavity; and
        a metal clip disposed on the housing for pressing the electronic package upon the contacts, the clip having a pair of arcuate lateral sides; and
    a pick up cap engagingly mounted on the clip of the connector, the pick up cap having a plane top surface adapted for being engaged by a vacuum suction device and a bottom surface, at least two supporting members formed at opposite lateral sides of the pick up cap respectively, each supporting member depending from the bottom surface of the pick up cap, the at least two supporting members attached on the arcuate lateral sides of the clip to support the pick up cap.

2. The LGA connector assembly as claimed in claim 1, wherein said at least two supporting members are a pair of parallel elongate arcuate ribs formed at the opposite lateral sides of the bottom surface of the pick up cap respectively.

3. The LGA connector assembly as claimed in claim 1, wherein said at least two supporting members are a pair of projecting members, each projecting member being cylindrical.

4. The LGA connector assembly as claimed in claim 1, wherein a pair of first clasps is formed at opposite sides of a front end of the pick up cap, the first clasps depending from the bottom surface and snappingly clasping a corresponding edge of the clip of the connector.

5. The LGA connector assembly as claimed in claim 4, wherein an opening is defined in a portion of the pick up cap adjacent a rear of each first clasp.

6. The LGA connector assembly as claimed in claim 1, wherein a T-shaped channel is defined in a middle of a rear end of the pick up cap, thereby forming a pair of opposing arms.

7. The LGA connector assembly as claimed in claim 6, wherein a pair of second clasps is formed at the rear end of the pick up cap, the second clasps depending from free ends of the arms respectively and snappingly clasping a corresponding edge of the clip of the connector.

8. The LGA connector assembly as claimed in claim 1, wherein a pair of protrusions is formed at opposite sides of a rear end of the pick up cap respectively, the protrusions depending from the bottom surface and abutting against a corresponding edge of the clip.

9. A pick up cap used in an electrical connector, comprising:
    a planar body having a plane top surface adapted for being engaged by a vacuum suction device and a bottom surface opposite to the top surface;
    a pair of first clasps formed at a front end of the planar body, each first clasp depending from the bottom surface of the planar body;
    a pair of spaced second clasps formed at a rear end of the planar body, each second clasp depending form the bottom surface of the planar body; and
    at least two supporting members formed at opposite lateral sides of the planar body respectively, each supporting member depending from the bottom surface of the planar body.

10. The pick up cap as claimed in claim 9, wherein the planar body is substantially rectangular.

11. The pick up cap as claimed in claim 9, wherein said at least two supporting members is a pair of parallel elongate arcuate ribs formed at the opposite lateral sides of the planar body respectively.

12. The pick up cap as claimed in claim 9, wherein said at least two supporting members is a pair of projecting members, each projecting member being cylindrical.

13. The pick up cap as claimed in claim 9, wherein an opening is defined in a portion of the planar body adjacent a rear of each first clasp.

14. The pick up cap as claimed in claim 9, wherein a T-shaped channel is defined in a middle of a rear end of the planar body thereby forming a pair of opposing arms, each second clasp depending from free ends of the arms.

15. A land grid array (LGA) connector assembly, comprising:
   an LGA connector, comprising:
      an insulative housing;
      a plurality of electrical contacts received in a portion of the housing; and
      a metal clip disposed on the housing and defining an uneven upward face with therein at least one recessed area on at least one side of the clip; and
   a pick up cap engagingly mounted on the clip of the connector, the pick up cap having a horizontal flat top surface adapted for being engaged by a vacuum suction device, at least one supporting member formed on an underside of the cap and seated upon the recessed area so as to avoid an unsupportable situation of said cap around said recessed area when a vacuum suction device is applied unto the cap.

16. The land grid array connector assembly as claimed in claim 15, wherein the cap includes more than one clasps grasping peripheral edges of the clip.

* * * * *